United States Patent [19]

Miyakawa

[11] Patent Number: 5,686,760
[45] Date of Patent: Nov. 11, 1997

[54] EUTECTIC CU-ALLOY WIRING STRUCTURE IN A SEMICONDUCTOR DEVICE

[75] Inventor: Kuniko Miyakawa, Tokyo, Japan

[73] Assignee: NEC Corporation, Tokyo, Japan

[21] Appl. No.: 558,524

[22] Filed: Nov. 16, 1995

[30] Foreign Application Priority Data

Nov. 16, 1994 [JP] Japan .................. 6-281043

[51] Int. Cl.⁶ ............................................. H01L 29/43
[52] U.S. Cl. .................. 257/751; 257/752; 257/757; 257/761; 257/762; 257/763; 257/915
[58] Field of Search ........................ 257/751, 752, 257/757, 758, 760, 761, 762, 763, 767, 764, 915

[56] References Cited

U.S. PATENT DOCUMENTS 4,843,453  6/1989  Hooper et al. .................. 257/762

OTHER PUBLICATIONS

IBM TDB, Utilization of Copper Transition Alloys in Integrated Circuits, vol. 35, No. 7, Dec. 1992, pp. 133–134.

Primary Examiner—Peter Toby Brown
Attorney, Agent, or Firm—Young & Thompson

[57] ABSTRACT

In a semiconductor device having a wiring groove in alignment with a contact hole, a wiring structure includes a diffusion preventing film formed on the bottom and side walls of the wiring groove, the diffusion preventing film being composed of a barrier metal for preventing diffusion of Cu and an element which cooperates with Cu so as to form a eutectic Cu-alloy having a eutectic temperature of not higher than 850° C. A Cu film is formed on the diffusion preventing film so as to fill up the wiring groove, so that Cu and the above mentioned element actually form the eutectic Cu-alloy having the eutectic temperature of not higher than 850° C.

9 Claims, 5 Drawing Sheets

EUTECTIC CU-ALLOY WIRING STRUCTURE IN A SEMICONDUCTOR DEVICE

BACKGROUND OF THE INVENTION

1. Field of the Invention

The present invention relates to a wiring structure in a semiconductor device, and more specifically to a conductor structure of a contact hole or a through hole and a wiring conductor in a semiconductor device.

2. Description of Related Art

With increased integration density of an integrated circuit, the width of a metal wiring conductor formed mainly of aluminum (Al) has now become ¼ µm or less. On the other hand, it is very important to reduce the wiring resistance in order to allow the integrated circuit to operate at a high speed.

Under this circumstance, the height of the metal wiring conductor has been necessarily increased to compensate the decrease in the width of the metal wiring conductor, so that the aspect ratio (height to width ratio) of the wiring conductor exceeds 1. As a result, the wiring conductor formation process has become very difficult.

In the formation of a contact hole and a via hole, because of fineness of the hole and the increased aspect ratio, coverage of a metal electrode formed by conventional sputtering has become poor, and an open circuit of a wiring conductor has frequently occurred in the wiring formation process.

In addition, it is, in some situations, difficult to reduce the wiring resistance by increasing the sectional area of the wiring conductor. Nevertheless, it is necessary to increase the operating current in order to realize a high speed operation of the integrated circuit, and therefore, there is such an inclination that the current density of the wiring conductor increases. The increase of the current density is a large cause resulting in increase of the wiring resistance caused because of electromigration and stress migration, and hence, resulting in lower reliability.

Under the above mentioned various circumstances, deterioration of reliability of the metal wiring conductor formed mainly of Al is serious.

In particular, in the case of a fine hole (such as a contact hole or a via hole) where a serious deterioration of reliability occurs, in order to overcome the above problems, there has been adopted an approach of depositing on a whole surface a tungsten (W) film having an excellent step coverage property, by chemical vapor deposition, and then, etching back the deposited tungsten film so as to remove the tungsten on the surface excluding the hole, and thereafter, sputtering an aluminum alloy, and finally patterning the depositing aluminum film by use of conventional exposure technology and a dry etching process so as to form a desired wiring conductor. However, if the aluminum alloy wiring conductor is connected through the tungsten to the contact hole or the via hole, the wiring resistance inevitably increases.

As mentioned above, the aluminum alloy is becoming difficult to meet with the fineness and the high speed operation of the integrated circuit. Therefore, attention has been now focused on copper (Cu) which has an electric resistivity smaller than aluminum, and a wiring technology of using a metal material containing the copper as a main component, is now actively developed. A large reason, other than a low electric resistivity, for which attention has been focused on copper, is that it is expected that migration hardly occurs in an operation of the device.

However, differently from the Al-based material, the Cu-based material has no good dry etching technology until now, and therefore, it is difficult to make a fine patterning. Because of this reason, namely, since it is difficult to finely pattern Cu-based material by the dry etching using photolithography, most of the wiring formation using the Cu-based material has been attempted by a groove wiring process.

For example, the Cu-based material is deposited, on a wafer having a groove previously formed in accordance with a wiring pattern, chemical vapor deposition having a groove filling-up property which can be expected to some degree, and thereafter, polishing is performed to remove extra copper on the surface oxide film.

Another process for filling up a wiring groove is known, in which, firstly, a barrier metal is sputtered onto a whole surface, and then, the Cu-based material is also sputtered, and thereafter, a heat treatment is performed to put the copper into a slush or semi-molten condition (solid phase - liquid phase mixed condition) so that the semi-molten copper flows into the groove, and furthermore, the copper and the barrier metal outside the groove are removed by the polishing.

Deposition of the Cu-based material by chemical vapor deposition for the purpose of forming the metal wiring conductor is not slower than the film deposition speed in the contact hole and the via hole by conventional sputtering. In other words, it has an excellent filling-up property. However, the Cu-based material film formed by chemical vapor deposition, has a film quality which cannot be satisfied in comparison with that obtained by sputtering, and in addition, has an electric resistivity which greatly varies to one site from another. Furthermore, in order to adopt chemical vapor deposition, it is necessary to provide new equipment.

Because of the above mentioned various reasons, the sputtering of the Cu-based material is an extremely excellent process, although the good groove filling-up property cannot be fundamentally expected, since it is possible to form a Cu-based material film having electric resistivity comparable to bulk copper, and since it is possible to easily change the film deposition condition only by exchanging the target material. Therefore, it is industrially extremely important to realize a Cu wiring technology using sputtering. The only defect of this sputtering is that selection property and the filling-up property cannot be expected.

In order to realize the Cu wiring technology using sputtering, it might be considered to put the deposited Cu into a semi-molten condition by a heat treatment so that the semi-molten Cu flows into the groove. However, since the melting point of Cu is high, and therefore, since a high temperature is required to put Cu into a semi-molten condition, this approach cannot be easily realized.

After a thermal oxidation process performed at an initial stage of a semiconductor device manufacturing process, the upper limit of the heat treatment temperature is considered to be the temperature (~850° C.) of a heat treatment for activation performed after an ion implantation. Therefore, for the Cu wiring technology, it is absolutely necessary to perform a thermal treatment for a reflow of Cu at a temperature not higher than 850° C. A heat treatment at a high temperature near the molting point of Cu can be hardly applied to the wiring formation step of the semiconductor manufacturing process. In addition, if the reflow of Cu is performed at a temperature lower than the melting point of Cu to some extent, heat treatment for a long term of time is required, with the result that the production efficiency inevitably drops.

SUMMARY OF THE INVENTION

Accordingly, it is an object of the present invention to provide a wiring structure in a semiconductor device, which has overcome the above mentioned defects of the conventional ones.

Another object of the present invention is to provide a Cu-based wiring structure in a semiconductor device, which can be realized by reflow at a low temperature, and which can therefore be manufactured with a high production efficiency.

The above and other objects of the present invention are achieved in accordance with the present invention by a wiring structure in a semiconductor device having at least one of a via hole and a contact hole and a wiring groove in alignment with the at least one of the via hole and the contact hole, the wiring structure including a diffusion preventing film formed on the bottom and side walls of the at least one of the via hole and the contact hole and on the bottom and side walls of the wiring groove, the diffusion preventing film being composed of a barrier metal for preventing diffusion of Cu and an element which cooperates with Cu so as to form an alloy having an eutectic temperature (liquidus temperature) not higher than 850° C., and a Cu film formed on the diffusion preventing film and filling the at least one of the via hole and the contact hole and the wiring groove.

According to another aspect of the present invention, there is provided a wiring structure in a semiconductor device having at least one of a via hole and a contact hole and a wiring groove in alignment with the at least one of the via hole and the contact hole, the wiring structure including a diffusion preventing film formed on the bottom and side walls of the at least one of the via hole and the contact hole and on the bottom and side walls of the wiring groove, the diffusion preventing film being composed of a barrier metal for preventing diffusion of Cu, and a Cu-alloy film formed on the diffusion preventing film and filling the at least one of the via hole and the contact hole and the wiring groove, the Cu-alloy film being composed of Cu and another element which form an alloy having an eutectic temperature (liquidus temperature) not higher than 850° C.

As mentioned hereinbefore, the highest temperature of the semiconductor manufacturing process after the wiring formation stage must be limited to not greater than 850° C. In order to realize this, the present invention adds an additive to Cu so that an eutectic temperature of the eutectic alloy composed of Cu and the additive is made lower than the melting point of Cu.

If the eutectic temperature becomes not greater than 850° C., the rule of experience shows that it is possible to perform a reflow at about 650° C., which is lower than the eutectic temperature by about 200° C. It is well known that alloying lowers its melting point, but it is also well known that alloying increases its electric resistivity. One of the intentions of using the Cu is that the electric resistivity of Cu is lower than that of Al. Therefore, it is one condition that even if the Cu alloy has an electric resistivity higher than that of Cu, the Cu alloy never exceeds the electric resistivity of Al.

The element added to Cu can be exemplified by antimony (Sb), silicon (Si), germanium (Ge), magnesium (Mg) and phosphorus (P), which can lower the eutectic temperature by addition of a slight amount, and can lower the eutectic temperature to a temperature not higher than 850° C., without causing the electric resistivity of the obtained eutectic Cu alloy to exceed the electric resistivity of Al.

In addition, if Cu is entered into a silicon semiconductor of $SiO_2$, it generates a deep impurity level, which gives an adverse influence to the characteristics of the device. In addition, it facilitates the diffusion. Namely, the Cu entered is one cause varying the characteristics of the device. Accordingly, it is necessary to prevent Cu from entering into the semiconductor or $SiO_2$ in a heat treatment performed after the heat treatment for the reflow. From this viewpoint, selection of the barrier metal which constitutes an underlying metal layer for the Cu, is important. For example, it is confirmed that tantalum (Ta), niobium (Nb), vanadium (V) and tungsten (W) have a satisfactory property as the barrier metal.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the wiring structure in accordance with the present invention will be described in detail with reference to FIGS. 1A to 1F, which are diagrammatical sectional views of semiconductor devices, for illustrating a process of manufacturing the first embodiment of the wiring structure.

Figure 1A:
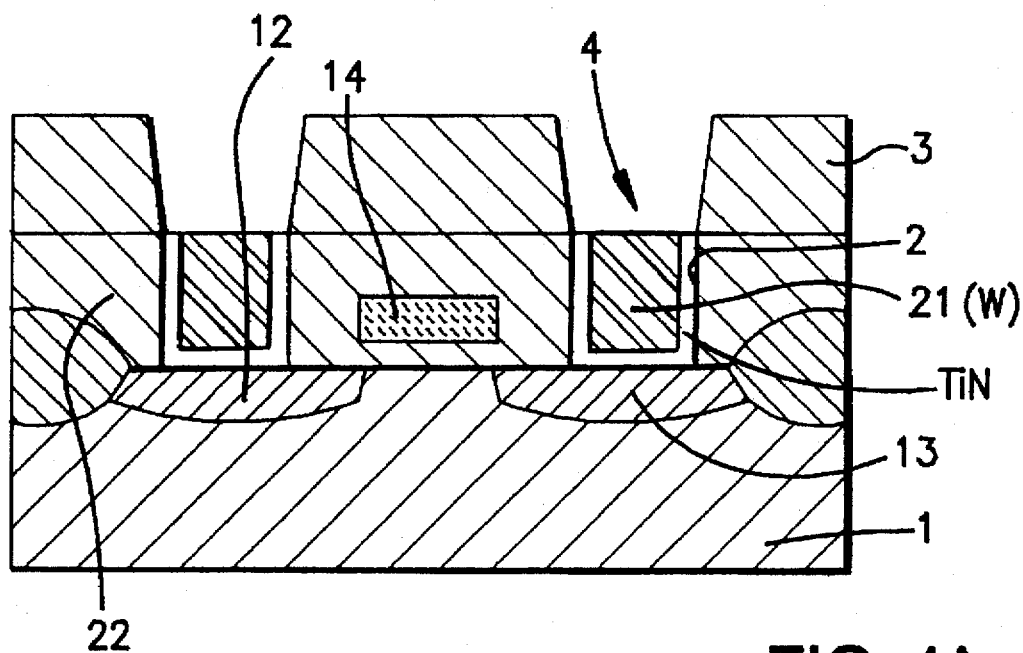
FIGS. 1A to 1E are diagrammatical sectional views of semiconductor devices, for illustrating a process of manufacturing a first embodiment of the wiring structure in accordance with the present invention.

The process of manufacturing the first embodiment of the wiring structure in accordance with the present invention will be described from a condition in which, as shown in FIG. 1A, a source 12 and a drain 13, and a gate insulator and a gate 14 of a MOS transistor have been already formed in and on a silicon substrate 1, and further, an insulating oxide film 22 is deposited.

First, a contact hole 2 is formed through the oxide film 22 in alignment with the source 12 and the drain 13, respectively. Then, a TiN film having a thickness of 100 nm is deposited by a sputtering, and a W film is also deposited by chemical vapor deposition (CVD) so as to fill up the contact hole 2.

Thereafter, the W film deposited on the oxide film 22 is removed by etching back, so that a tungsten (W) contact 21 is completed. Then, an interlayer insulating film 3 is deposited on a planarized surface of the insulating oxide film 22 including the tungsten contacts 21, and a first wiring groove 4 having a downward tapered sectional shape or an equilateral trapezoidal sectional shape having its upper side longer than its under side, is formed through the interlayer insulator film 3 as shown FIG. 1A.

Figure 1B:
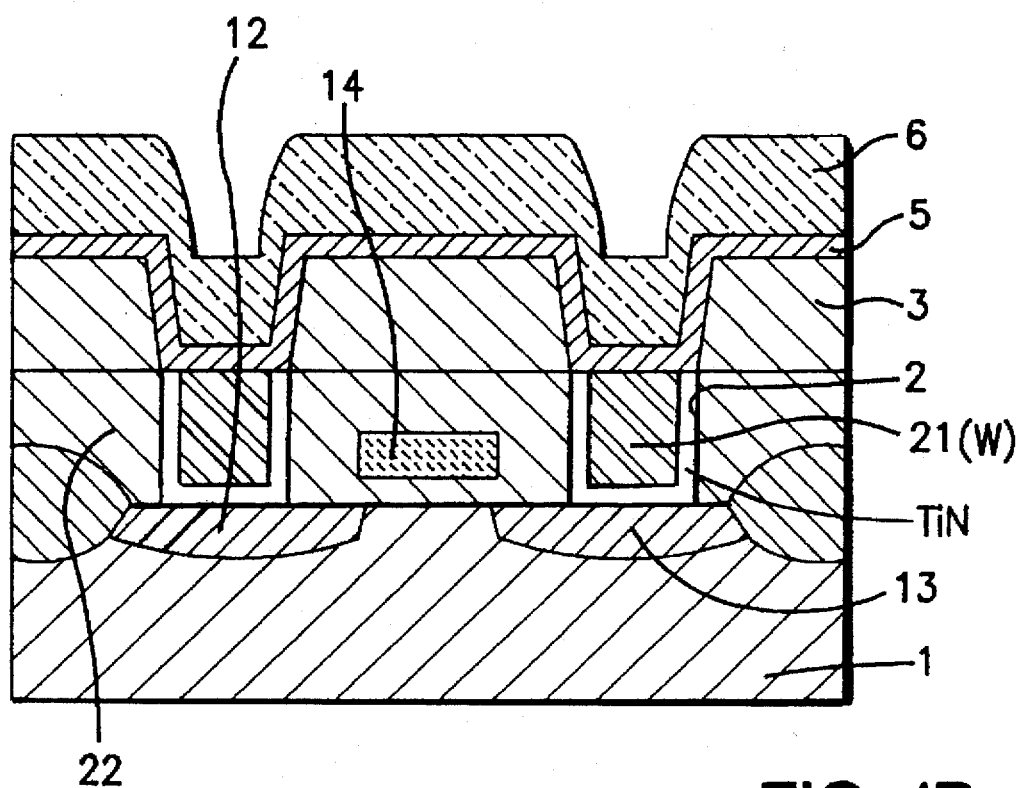
Figure 1C:
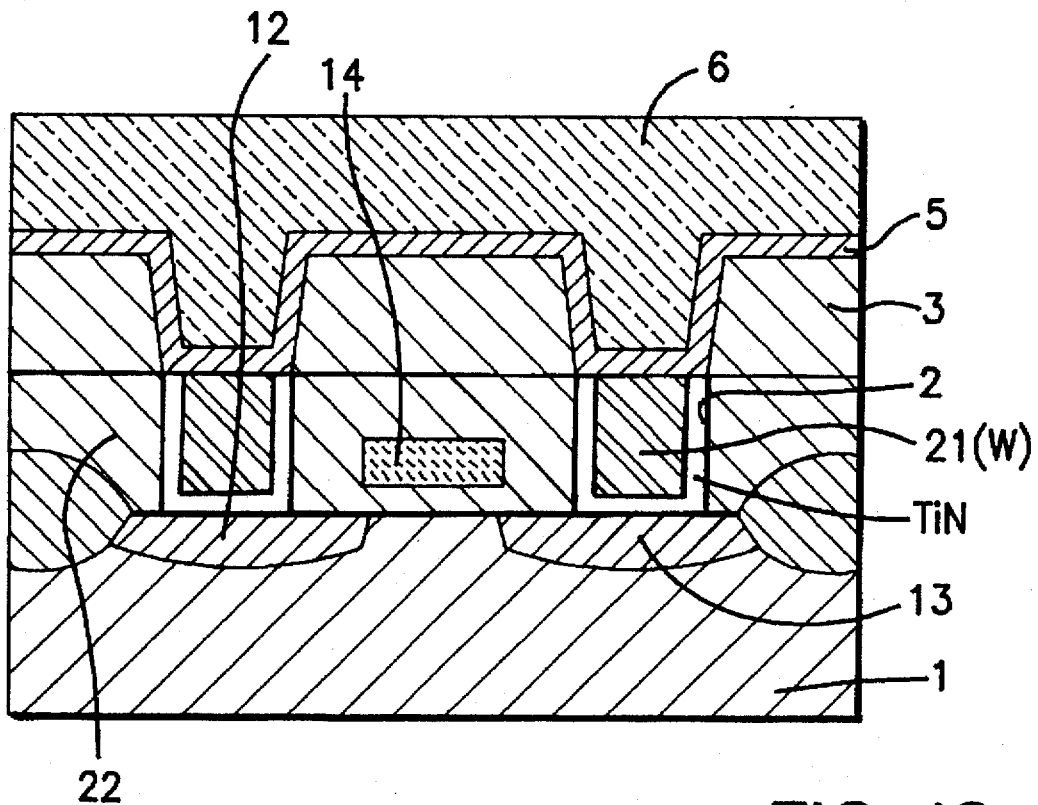

Succeedingly, a TaSb alloy (TaSbx) film 5 containing 10 weight percent of Sb and having a thickness of 50 nm is deposited, and a Cu film 6 having a thickness of 500 nm is deposited, as shown in FIG. 1B. Furthermore, without breaking the vacuum condition of the film deposition apparatus, a reflow is performed at 450° C. for three minutes, so that the first wiring groove 4 is filled with Cu, and an upper surface of the Cu film 6 is substantially planarized, as shown in FIG. 1C.

In the shown embodiment, the TaSb alloy film 5 and the Cu film 6 are deposited by collimate sputtering in order to ensure that the film thickness in the first wiring groove 4 is not smaller than that of the other portion.

The Sb concentration of a sputter target used for depositing the TaSb alloy film 5 has an optimum value dependent upon the width of the first wiring groove, the film thickness of the TaSb alloy film 5, the heat treatment temperature for the reflow. Even if the Sb concentration is 0.1 weight percent, the reflow can be performed at a sufficiently low temperature.

In order to maintain the electric resistivity as low as possible, the Sb concentration is preferred to be low. However, the electric resistivity of a wiring obtained when there is used a target containing 15 weight percent of Sb exceeding 11 weight percent of Sb which is the solid solution limit, is lower than that of the Al based wiring.

In the shown embodiment, a target containing 10 weight percent of Sb is used. The fact that the Cu film 6 is deposited without breaking the vacuum condition after the TaSb alloy film 5 is deposited, can completely prevent a surface of the TaSb alloy film 5 from being exposed to atmosphere. This is very convenient to the succeeding reflow process.

As mentioned above, FIG. 1C shows the condition in which the first wiring groove 4 is filled with Cu as the result of the heat treatment for the reflow. In the shown embodiment, the first wiring groove 4 can be filled with Cu, by performing the reflow at 450° C. for three minutes.

The solid solution limit of Sb in Cu is 11 weight percent. In this condition, the eutectic temperature drops to 644° C, which is sufficiently lower than the 1083° C. melting point of Cu. Therefore, it can be considered that the reflow easily occurs at as a low temperature as 450° C. However, it is not necessarily required that Sb is uniformly mixed in Cu. It has been confirmed from experiment that the reflow occurs because the Sb concentration in the Cu film 6 elevates in a region adjacent to a boundary between the Cu film 6 and the TaSb alloy film 5.

Because of the above mentioned reasoning, the Cu film 6 can be easily reflowed on the barrier metal of the TaSb alloy film 5 which is formed by sputtering a TaSn alloy target containing Sb in a wide composition range of 0.1 weight percent to 15 weight percent.

Figure 1D:
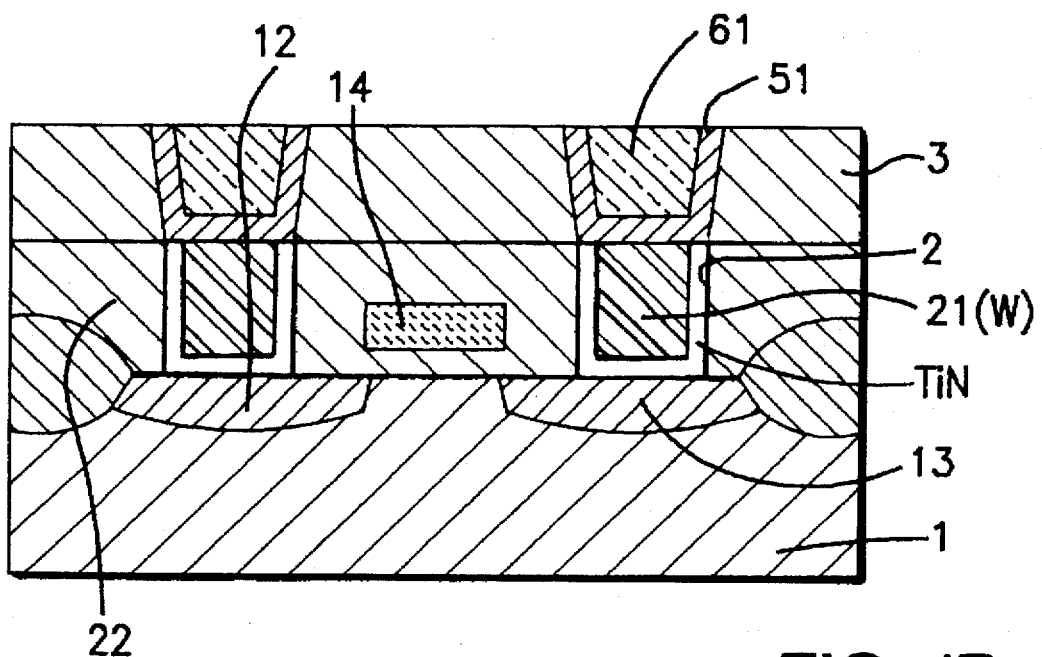

After the reflow of the Cu film 6 into the first wiring groove 4, Cu and TaSb alloy remaining on the region of the interlayer insulating film 3 other than the first wiring groove 4, are removed by a chemical and mechanical polishing. Thus, the first groove wiring composed of the remaining TaSb 51 and Cu 61 is formed as shown in FIG. 1D.

Figure 1E:
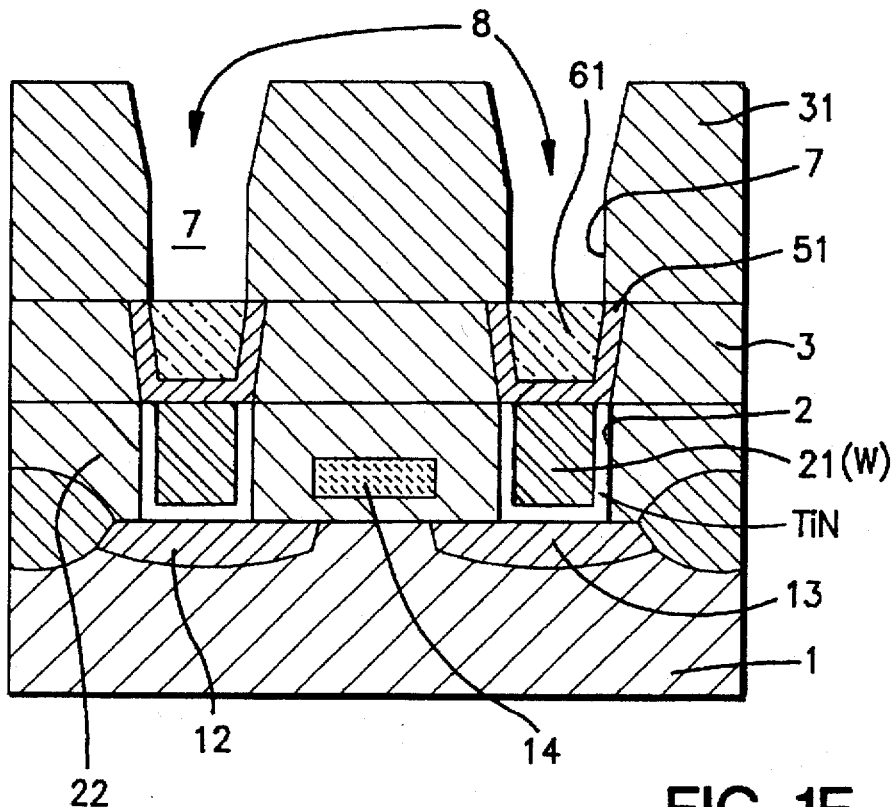
Figure 1F:
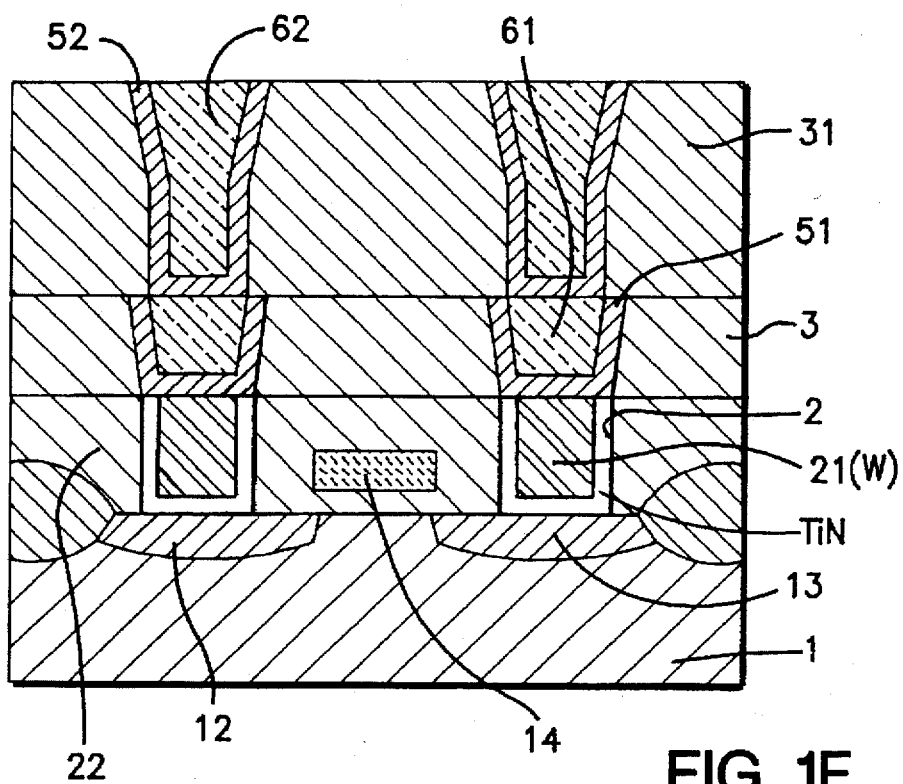

FIGS. 1E and 1F illustrate a process of forming a second groove wiring on the first groove wiring thus formed. The second groove wiring can be formed similarly to formation of the first groove wiring.

Namely, a second interlayer insulating film 31 is deposited on the first groove wiring, and a via hole 7 and a second wiring groove 8 are formed through the second interlayer insulating film 31, as shown in FIG. 1E.

Then, a TaSb alloy film 51 and a Cu film 62 are deposited by sputtering, and a reflow heat treatment and a chemical and mechanical polishing are performed to form the second groove wiring as shown in FIG. 1F.

When the first groove wiring was formed, the tungsten was previously filled into the contact hole 2. However, when the second groove wiring was formed, the TaSb alloy film 52 and the Cu film 62 are directly charged into the via hole 7 and the second wiring groove 8.

This method of simultaneously filling the via hole 7 and the second wiring groove 8 in the process of the second groove wiring formation, is very excellent from the viewpoint of process simplicity, if the aspect ratio is relatively small.

However, if the wiring groove and the via hole have a large aspect ratio, a process similar to the process of the first groove wiring formation can be performed. Namely, after the via hole 7 is filled with tungsten, another interlayer insulating film is deposited, and the second wiring groove 8 is formed in the another interlayer insulating film. The TaSb alloy film 51 and the Cu film 61 are charged into the second wiring groove 8, and a reflow process is performed.

Thus, any multilayer wiring structure can be formed by repeating the above mentioned processes.

Next, a second embodiment of the wiring structure in accordance with the present invention will be described in detail with reference to FIGS. 2A to 2C, which are diagrammatical sectional views of semiconductor devices, for illustrating a process of manufacturing the second embodiment of the wiring structure, after the first groove wiring as shown in FIG. 1D has been completed.

Figure 2A:
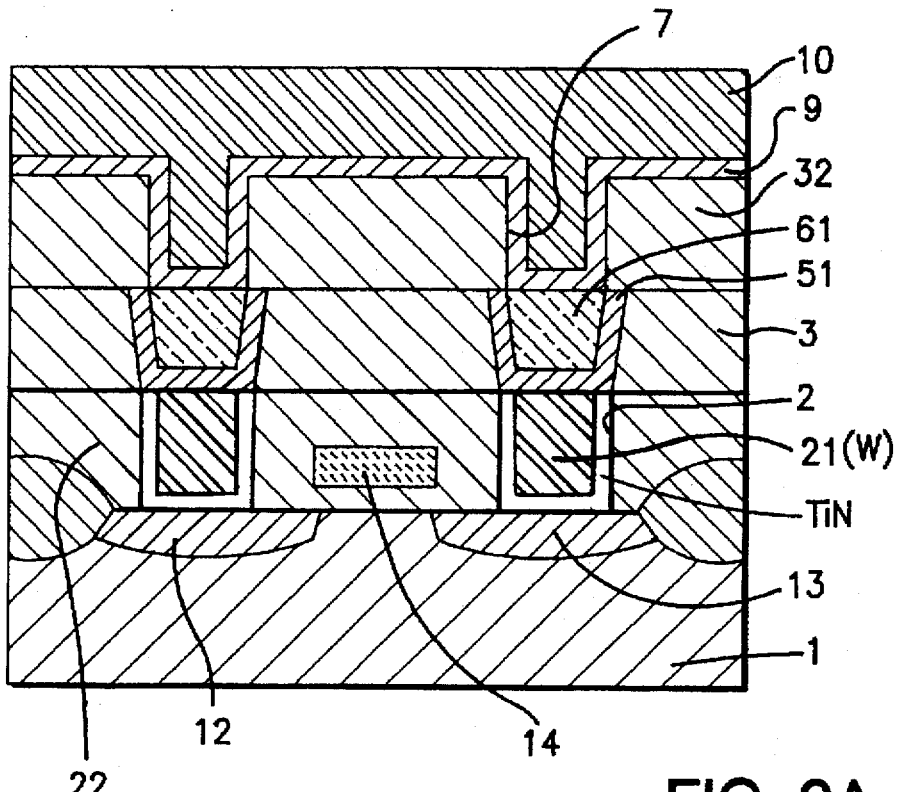
FIGS. 2A to 2C are diagrammatical sectional views of semiconductor devices, for illustrating a process of manufacturing a second embodiment of the wiring structure in accordance with the present invention.
Figure 2B:
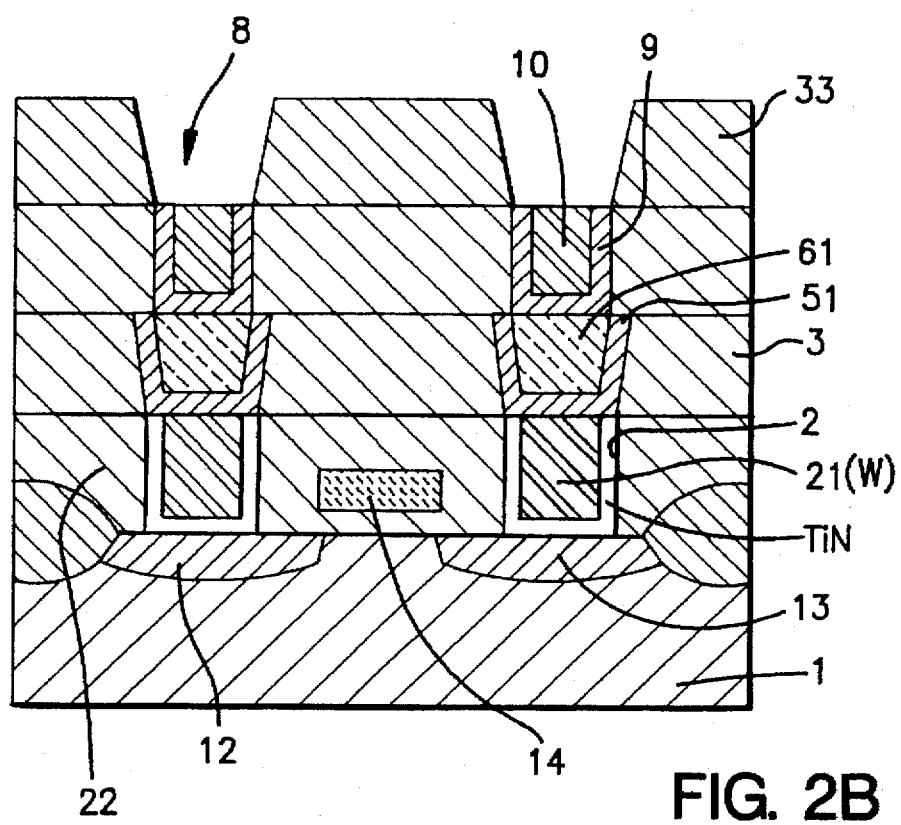
Figure 2C:
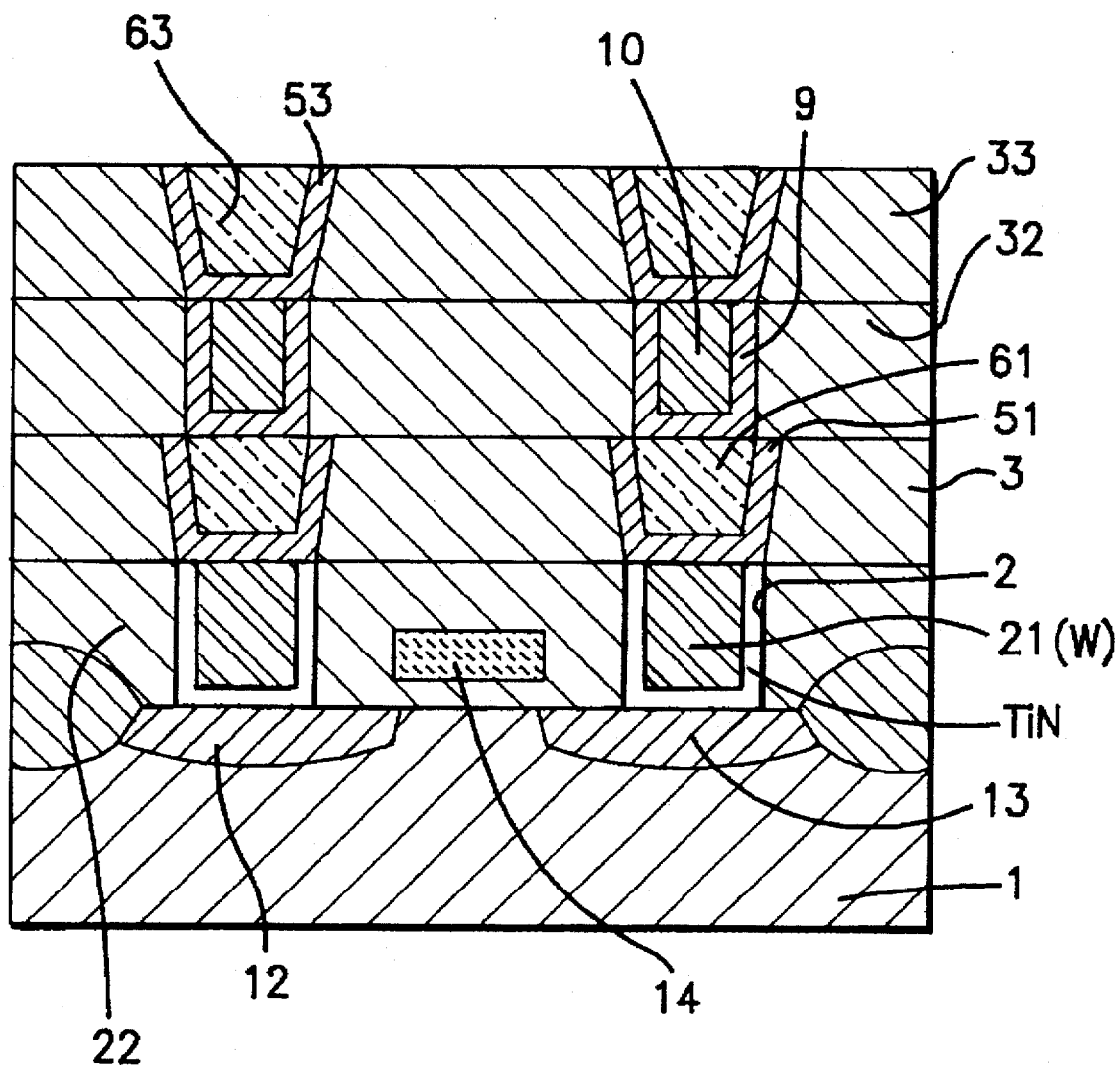

As shown in FIG. 2A, an interlayer insulating film 32 is deposited on the interlayer insulating film 3 containing the first groove wiring, and a via hole 7 is formed through the interlayer insulating film 32 in alignment with the first groove wiring. A TiN film 9 is deposited on a bottom and a side wall of the via hole 7, and then, a tungsten film 10 is deposited to fill the via hole 7.

Thereafter, the tungsten film 10 deposited on the interlayer insulating film 32 is removed by an etching back, and a further interlayer insulating film 33 is deposited. A second wiring groove 8 having a downward tapered sectional shape is formed through the interlayer insulator film 33 as shown FIG. 2B.

Succeedingly, similarly to the first embodiment, a TaSb alloy film is deposited, and a Cu film is deposited on the deposited TaSb alloy film. Then, without breaking the vacuum condition, the reflow is performed at 450° C. for three minutes, so that the second wiring groove 8 is filled with Cu.

After the reflow of the Cu film into the second wiring groove 8, Cu and TaSb alloy remaining on the region of the interlayer insulating film 33 other than the second wiring groove 8, are removed by a chemical and mechanical polishing. Thus, the second groove wiring composed of the remaining TaSb 53 and Cu 63 is formed as shown in FIG. 2C.

As mentioned above, the melting point of Cu is lowered by making a Cu alloy, so that the reflow becomes possible at a heat treatment of not high that 850° C. In the embodiments as mentioned above, the underlying metal for the Cu film is in the form of TaSb including Sb, and at the time of heat treatment, Sb is caused to be mixed with Cu so that the melting point of Cu is lowered, with the result that the reflow heat treatment temperature is lowered.

In other words, the embodiments as mentioned above are such that Sb is previously mixed with Ta which is barrier metal for Cu, in order to lower the reflow temperature. However, the same effect can be obtained when the barrier metal composed of only Ta is formed in place of the TaSb barrier film 5, and in place of the Cu film 6, a CuSb alloy film is deposited by using a CuSb alloy target (Cu mixed with Sb).

In addition, the low temperature reflow is possible by adding the Sb at an initial stage of the Cu film sputtering process, or by alternately sputtering Cu and Sb at the initial stage of the Cu film sputtering process. In these modified processes, if the sputtering is performed while heating the substrate at the reflow temperature, the reflow can be performed in parallel to the film deposition.

The lowering of the reflow temperature is not influenced by the process for depositing the Cu film and the barrier metal and the method of introducing Sb into the Cu film or the barrier metal. Therefore, various methods other than the above mentioned processes can be adopted.

In the above mentioned embodiments, Sb has been selected as the element causing the lowering of the melting point of Cu. However, it is to be noted that not only Sb but also Si, Ge, Mg and P can lower the reflow temperature of Cu. The reason for the fact that these elements are effective in lowering the reflow temperature of Cu, is that (1) the amount of addition of these elements required to lower the reflow temperature to not higher than 850° C. is small as not higher than 15 weight percent, and (2) the increase of the electric resistivity of the obtained Cu wiring due to the alloy scattering is very slight, so that the electric resistivity does not exceed that of Al.

In the above mentioned embodiments, Ta is used as the barrier metal for preventing Cu of the wiring material from diffusing into the semiconductor and $SiO_2$. Nb, V and W can be used in place of Ta, since these elements can prevent Cu from diffusing into the semiconductor and $SiO_2$.

As mentioned above, the TaSb alloy film 5, 52, 53 containing Sb which forms a eutectic Cu alloy having a eutectic temperature of not higher that 850° C., is deposited on a bottom and a side wall of each of the contact hole 2, the via hole 7, the first wiring groove 4 and the second wiring groove 8, and then, the Cu film 6, 62, 63 is deposited on the deposited TaSb alloy film, and thereafter, the reflow heat treatment is performed so that the contact hole 2, the via hole 7, the first wiring groove 4 and the second wiring groove 8, are filled with Cu. Thus, it is possible to reflow, at a low temperature and for a short term of time, Cu which has a low electric resistivity and which can be formed by sputtering so that the electric resistivity does not widely change from one site to another.

With the above mentioned technology, it is possible to easily completely charge Cu into a wiring groove having a width of not greater than 0.3 μm and a depth of not less than 0.5 μm. In this case, the electric resistivity can be made smaller than that of the conventional Al wiring, and therefore, it is possible to realize a semiconductor integrated circuit with a high speed of operation.

In addition to the above mentioned features, the above mentioned technology can avoid various problems of wiring deterioration such as a stress migration and electromigration which were problems in the Al wiring. Therefore, reliability of the device can be remarkably increased.

The use of sputtering makes it possible to form the device in the same sputtering apparatus, by preparing targets of Cu and Additive element for forming the carrier metal and for enabling the reflow. Accordingly, the capital investment in the manufacturing installation can be decreased, and the number of steps in the manufacturing process can be reduced. These features reduce the manufacturing cost and elevate the production efficiency.

The eutectic Cu-alloy wiring structure in accordance with the present invention can be manufactured by not only the above mentioned processes but also the following processes.

The process for forming, in a semiconductor device, a wiring structure interconnecting between at least one of a via hole and a contact hole and a wiring groove in alignment with the at least one of the via hole and the contact hole, comprises a first step of depositing a diffusion preventing film composed of a barrier metal for preventing diffusion of Cu, on the bottom and side walls of the at least one of the via hole and the contact hole and on the bottom and side walls of the wiring groove, a second step of depositing on the diffusion preventing film a Cu-alloy film composed of Cu and another element which form an alloy having an eutectic temperature of not higher than 850° C., and a third step of filling up the wiring groove and the at least one of the via hole and the contact hole, with the Cu-alloy film by a reflow heat treatment.

In the above mentioned process, the diffusion preventing film can be formed by either sputtering or chemical vapor deposition. Alternatively, or in addition, the Cu-alloy film can be deposited by a sputtering at room temperature. When the Cu-alloy film is deposited by a sputtering at room temperature, the third step of filling up the wiring groove and the at least one of the via hole and the contact hole can be performed by heating the sputter-deposited Cu-alloy film at a high temperature not higher than 500° C., so as to cause the Cu-alloy film to reflow and to fill up the wiring groove and the at least one of the via hole and the contact hole.

The invention has thus been shown and described with reference to the specific embodiments. However, is should be noted that the present invention is in no way limited to the details of the illustrated structures but changes and modifications may be made within the scope of the appended claims.

I claim:

1. A wiring structure in a semiconductor device having a connection hole in alignment with another connection hole, the wiring structure including a diffusion preventing film formed on the bottom and side walls of each said hole, the diffusion preventing film being composed of a barrier metal for preventing diffusion of Cu and an element which cooperates with Cu so as to form an alloy having an eutectic temperature of not higher than 850° C., and a Cu film formed on the diffusion preventing film and filling each said hole.

2. A wiring structure claimed in claim 1 wherein the alloy of Cu and said element has an electric resistivity lower than that of Al.

3. A wiring structure claimed in claim 2 wherein said element is one selected from the group consisting of antimony (Sb), silicon (Si), germanium (Ge), magnesium (Mg), and phosphorus (P).

4. A wiring structure claimed in claim 3 wherein said element contained in said diffusion preventing film is in a composition range of 0.1 weight percent to 15 weight percent to said barrier metal.

5. A wiring structure claimed in claim 4 wherein said barrier metal is one selected from the group consisting of tantalum (Ta), niobium (Nb), vanadium (V) and tungsten (W).

6. A wiring structure in a semiconductor device having a via hole and a wiring groove in alignment with the via hole, the wiring structure including a diffusion preventing film formed on the bottom and side walls of the via hole and on the bottom and side walls of the wiring groove, the diffusion preventing film being composed of a barrier metal for preventing diffusion of Cu, and a Cu-alloy film formed on the diffusion preventing film and filling the via hole and the wiring groove, the Cu-alloy film being composed of Cu and another element which form an alloy having an eutectic temperature not higher than 850° C.

7. A wiring structure claimed in claim 6 wherein the alloy of Cu and said element has an electric resistivity lower than that of Al.

8. A wiring structure claimed in claim 7 wherein said element is one selected from the group consisting of antimony (Sb), silicon (Si), germanium (Ge), magnesium (Mg) and phosphorus (P).

9. A wiring structure claimed in claim 8 wherein said barrier metal is one selected from the group consisting of tantalum (Ta), niobium (Nb), vanadium (V) and tungsten (W).

* * * * *